(12) United States Patent
Jin

(10) Patent No.: US 7,563,120 B1
(45) Date of Patent: Jul. 21, 2009

(54) ELECTRICAL CONNECTOR

(75) Inventor: Zuo Feng Jin, Qingyang (CN)

(73) Assignee: Lotes Co., Ltd., Anloku, Keelung (TW)

( * ) Notice: Subject to any disclaimer, the term of this patent is extended or adjusted under 35 U.S.C. 154(b) by 0 days.

(21) Appl. No.: 12/172,363

(22) Filed: Jul. 14, 2008

(30) Foreign Application Priority Data

Jan. 23, 2008 (CN) .................... 2008 2 0043223 U

(51) Int. Cl.
*H01R 13/625* (2006.01)
(52) U.S. Cl. .................................. 439/342
(58) Field of Classification Search ............ 439/310, 439/342, 264, 268
See application file for complete search history.

(56) References Cited

U.S. PATENT DOCUMENTS

| | | | | |
|---|---|---|---|---|
| 7,056,140 | B1 * | 6/2006 | Jiang ........................ | 439/342 |
| 7,108,536 | B2 * | 9/2006 | Yu et al. .................... | 439/342 |
| 7,114,977 | B2 * | 10/2006 | Lei et al. ................... | 439/342 |
| 7,473,122 | B2 * | 1/2009 | Zhou et al. ................. | 439/342 |

* cited by examiner

*Primary Examiner*—Neil Abrams
*Assistant Examiner*—Phuong Nguyen
(74) *Attorney, Agent, or Firm*—Morris Manning Martin LLP; Tim Tingkang Xia, Esq.

(57) ABSTRACT

The invention discloses an electrical connector comprising a base, a cover, and a drive mechanism. The drive mechanism includes a rotatable pin and a pushing blade. At least two columns are bias disposed on the rotatable pin. The column which is near the cover is disposed in the axle hole. The pushing blade is mounted on the cover for pushing and reinforcing the cover. The pushing blade has at least one block portion which corresponds to the rotatable pin. The pushing blade also has a long round hole for accommodating the rotatable pin. Compared with prior arts, the drive mechanism of the electrical connector of the invention includes a pushing blade which is capable of reinforcing the cover while pushing the cover to prevent the cover from deformation or breakage.

9 Claims, 7 Drawing Sheets

ELECTRICAL CONNECTOR

BACKGROUND OF THE INVENTION

1. Field of the Invention

This invention relates to an electrical connector and, more particularly to an electrical connector whose drive mechanism includes a pushing blade. The pushing blade not only can push a cover to slide but also can reinforce the cover.

2. Description of the Prior Art

Presently, an electrical connector in existence is used for connecting a chip module and a motherboard. The electrical connector usually includes a base, a cover, a plurality of contacts, and a drive mechanism. The base has a plurality of receiving holes which pass through the base. The receiving holes are used for receiving the contacts. The cover is able to slide parallelly to the upper surface of the base. The cover has a plurality of through holes corresponding to the plurality of receiving holes on the base. The through holes are able to be inserted by a plurality of pins of the chip module to be electrically connected to the contacts of the base. The drive mechanism includes a cam, a pushing blade, a reinforcement blade, and a washer. The pushing blade is tabular and is disposed on the upper surface of the cover. The reinforcement blade is also tabular, and is formed on the lower surface of the cover individually from the pushing blade. That is to say, by holding the cover between the pushing blade and the reinforcement blade, the cover can be reinforced and prevented from deformation or breakage by the excess pushing force induced while the cam rotates. Because it requires more materials to form the pushing blade and the reinforcement blade individually, the cost of the electrical connector increases. Moreover, it also requires two processes to form the pushing blade and the reinforcement blade respectively during the manufacturing of the electrical connector. Thus, the complexity of the processes increases. Besides, it also requires two processes to assemble the pushing blade and the reinforcement blade to the cover respectively during the assembly of the electrical connector. It is troublesome and wastes a lot of time.

Accordingly, the scope of the invention is to provide an electrical connector, so as to solve the foregoing problems.

SUMMARY OF THE INVENTION

One scope of the invention is to provide an electrical connector whose drive mechanism includes a pushing blade, and the pushing blade has functions of pushing and reinforcing a cover.

In order to achieve the foregoing scope, the electrical connector of the invention includes a base, a cover, and a drive mechanism. The base has an aperture. The cover is disposed on the base and slide parallelly to the base. The cover has an axle hole which corresponds to and is larger than the aperture. The drive mechanism includes a rotatable pin and a pushing blade. At least two columns are bias disposed on the rotatable pin. The column which is near the cover is disposed in the axle hole. The pushing blade is mounted on the cover for pushing and reinforcing the cover. The pushing blade has at least one block portion which corresponds to the rotatable pin. The pushing blade also has a long round hole for accommodating the rotatable pin.

Compared with prior arts, the drive mechanism of the electrical connector of the invention includes a pushing blade. The pushing blade is capable of reinforcing the cover while pushing the cover, thus the cover is prevented from deformation or breakage. In addition, the structure of the electrical connector of the invention is simpler and do not need to be fabricated individually in processes, so that the materials can be saved and the assembly processes can be simplified.

BRIEF DESCRIPTION OF THE APPENDED DRAWINGS

DETAILED DESCRIPTION OF THE INVENTION

The advantage and spirit of the electrical connector of the invention may be understood by the following recitations together with the appended drawings.

Figure 1:
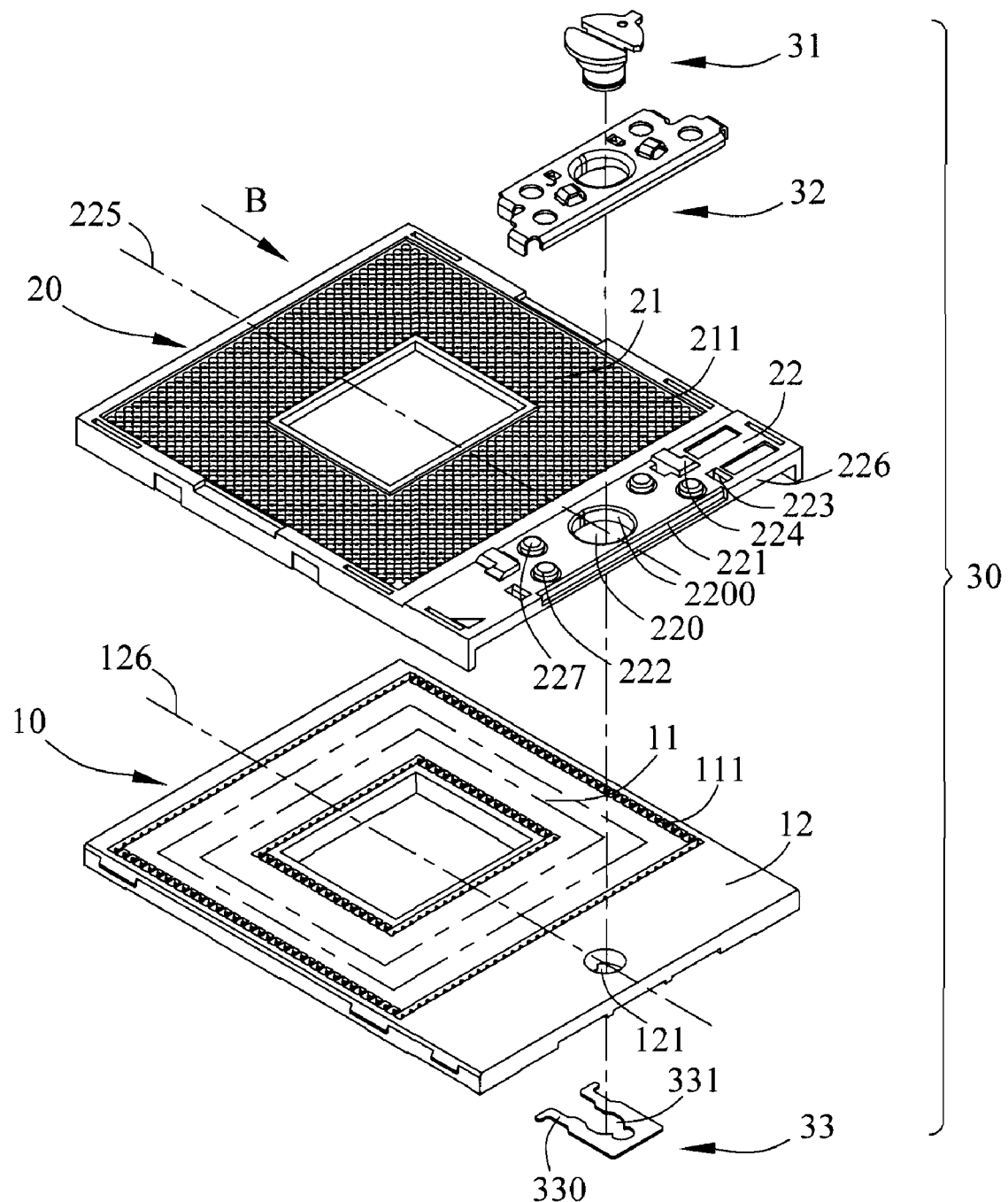
FIG. 1 is an exploded view illustrating the electrical connector according to an embodiment of the invention.

Please refer to FIG. 1. FIG. 1 is an exploded view illustrating the electrical connector according to an embodiment of the invention. The electrical connector 1 of the invention includes a base 10, a cover 20, and a drive mechanism 30. The drive mechanism 30 includes a rotatable pin 31, a pushing blade 32, and a washer 33. The cover 20 is disposed on the base 10 and is driven by the drive mechanism 30 to slide parallelly to the base 10 along the direction at which the arrow B points.

Figure 3:
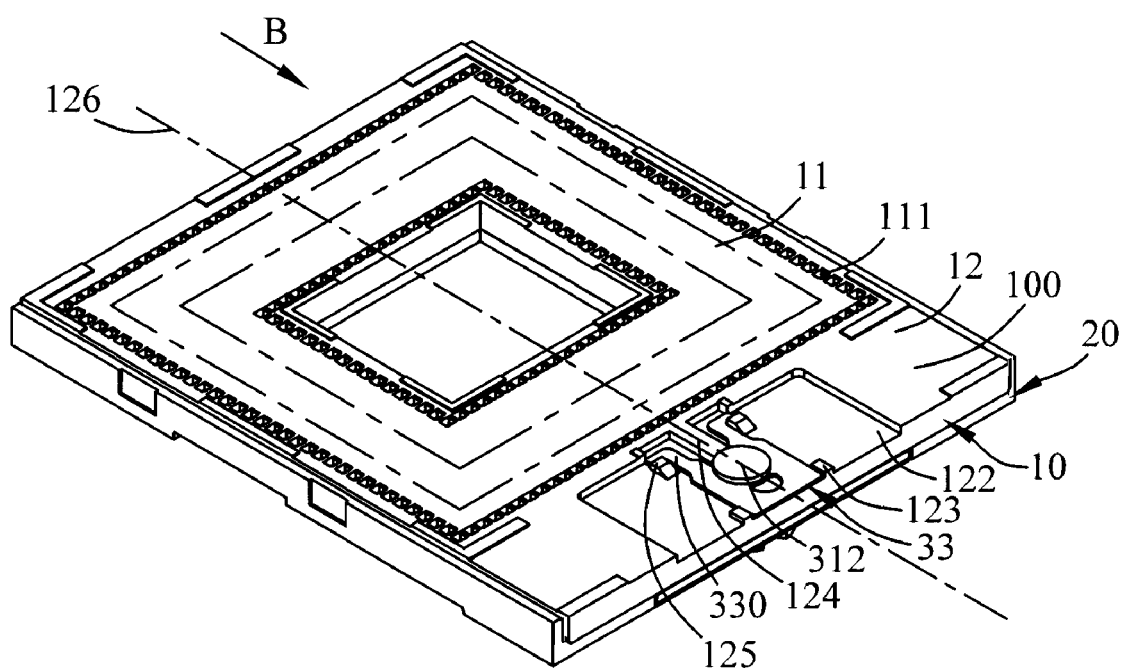
FIG. 3 is a schematic diagram of another angle of view illustrating the electrical connector shown in FIG. 1.

Please refer to FIG. 1 and FIG. 3. The base 10 includes a first reception portion 11 and a first head portion 12. The first reception portion 11 has a plurality of contact receiving holes 111 for receiving a plurality of contacts (not shown in figures). The first head portion 12 has an aperture 121 passing through the first head portion 12, and the aperture 121 is located at the center of the first head portion 12. A recess portion 122 is formed at the center of a lower surface 100 of the first head portion 12. The lower surface 100 of the recess portion 122 where near the aperture 121 is disposed two uniform first bulges 123 and two uniform second bulges 125. The four bulges are arranged to form a square. A ribbed strip 124 is disposed on the recess portion 122. The ribbed strip 124 extends from where the first reception portion 11 intersects to the first head portion 12 to the aperture 121 without entering the aperture 121. The ribbed strip 124 is parallel to a symmetric axle 126 of the recess portion 122, and the symmetric axle 126 is parallel to the direction at which the arrow B points. Besides, the two first bulges 123 are disposed at two sides of the ribbed strip 124 symmetrically, and the two second bulges 125 are also disposed at two sides of the ribbed strip 124 symmetrically.

Figure 2:
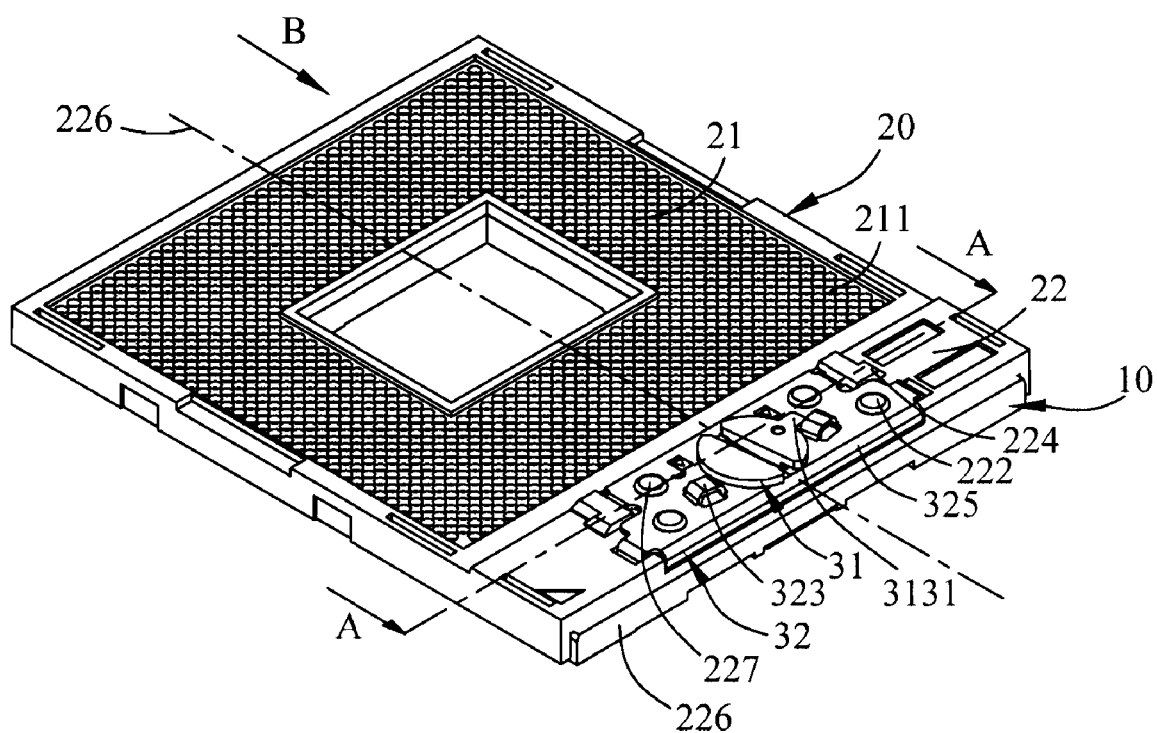
FIG. 2 is an assembly diagram illustrating the electrical connector shown in FIG. 1.

Please refer to FIG. 1 and FIG. 2. The cover 20 includes a second reception portion 21 and a second head portion 22. The second reception portion 21 has a plurality of through holes 211 according to the plurality of contact receiving holes 111 on the first reception portion 11. The plurality of through holes 211 are used to be inserted by pins of a chip module (not shown in figures). An axle hole 220 is formed at the center of the second head portion 22, and the cross-section of the axle hole 220 is long round shaped. The width of the axle hole in the direction parallel to a symmetric axle 225 of the cover 20 is smaller than that of the axle hole in the direction perpendicular to the symmetric axle 225. It is notable that the direction of the symmetric axle 225 is parallel to the direction at which the arrow B points. An engaging groove 221 is formed at the distal wall 226 of the second head portion 22 toward the second reception portion 21, and the width of the engaging groove 221 is smaller than that of the second head portion 22. Two uniform first protrusions 222 and two uniform second protrusions 227 are disposed near the axle hole 220, and the four protrusions are columned. The first protrusions 222 are adjacent to the side of the engaging groove 221, and the second protrusions 227 are adjacent to the side of the second reception portion 21. The distance between the second protrusions 227 is smaller than that between the first protrusions 222, so that the four protrusions form an isosceles trapezoid on the cover 20. Two through grooves 223 are formed at outer sides of the two first protrusions 222 symmetrically respective to the symmetric axle 225. Two tapered posts 224 are disposed symmetrically adjacent to the through grooves 223. The tapered posts 224 are adjacent to the second reception portion 21. The engaging groove 221, the first and second protrusions 222(227), the through grooves 223, and the tapered posts 224 are engaged with each other to fix the pushing blade 32.

Please refer to FIG. 1, FIG. 5, FIG. 6, and FIG. 7. The drive mechanism 30 of the invention includes the rotatable pin 31, the pushing blade 32, and the washer 33.

The rotatable pin 31 is consisted of a first column 311 and a second column 312 which are bias. A rotatable portion 313 is extended form the first column 311, and a rotatable groove 3130 is disposed on the rotatable portion 313. The rotatable groove 3130 partially extends to enter the first column 311, and the rotatable groove 3130 can be inserted by tools such as a screwdriver (not shown in figures) to rotate the rotatable pin 31. Besides, a block 3131 is extended from the rotatable portion 313 in horizontal direction. The diameter of the first column 311 is larger than that of the second column 312. An annular groove 3120 is formed at the distal end of the second column 312.

The pushing blade 32 has a second surface 322 which contacts the upper surface of the second head portion 22 of the cover 20. Besides, the pushing blade 32 has a first surface 321 relative to the second surface 322. A long round hole 320 is disposed at the center of the pushing blade 32. The shape of the long round hole 320 is similar to that of the axle hole 220 on the second head portion 22 of the cover 20. The long round hole 320 extends a long round ring 3200 toward the second surface 322, and the long round ring 3200 enters the axle hole 220. The long round ring 3200 is formed by extrusion. The long round ring 3200 has a force-pushed region 3201. While rotating, the rotatable pin 31 applies a force to the force-pushed region 3201 on the long round ring 3200 rather than to the cover 20. Thus, the deformation or breakage of the plastic of the cover 20 can be prevented while the rotatable pin 31 rotates, and the cover 20 can be reinforced. Each of two sides of the long round hole 320 has a block portion 323 protruding toward the first surface 321. The block portion 323 can engage with the block 3131 of the rotatable pin 31 to prevent the rotatable pin 31 over-rotating. Two first positioning holes 324 and two second positioning holes 329 are formed symmetrically at the outer sides of the block portions 323. The first positioning holes 324 and the second positioning holes 329 correspond to and cooperate with the first protrusions 222 and the second protrusions 227 disposed on the second head portion 22 of the cover 20 respectively. Plate-shaped reinforcing ribs extend downward from the edges of the pushing blade 32, and the reinforcing ribs are a first reinforcing rib 325 and a second reinforcing rib 326, the first reinforcing rib 325 is perpendicular to the second reinforcing rib 326. The first reinforcing rib 325 engages with the engaging groove 221 of the cover 20, and the second reinforcing rib 326 is engaged with the through groove 223 of the cover 20 for further reinforcing the cover 20.

Please refer to FIG. 1. The washer 33 of the drive mechanism 30 has two engaging foots 330. A circular hole 331 is formed on the washer 33. The engaging foots 330 form a part of the circular hole 331. The circular hole 331 is used for being entered by the second column 312 and making the annular groove 3120 of the second column 312 to engage with the engaging foots 330.

Figure 4:
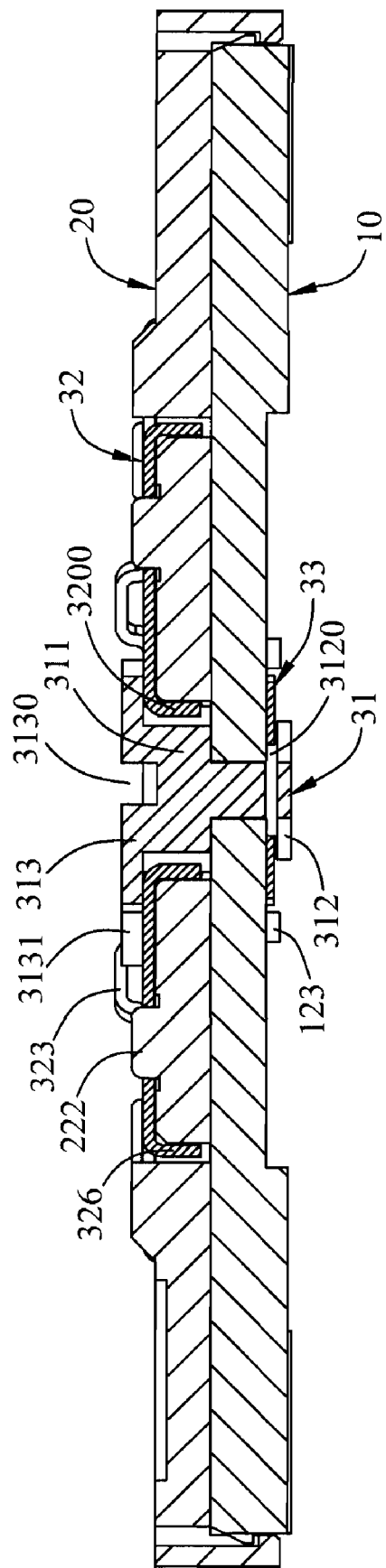
FIG. 4 is a cross-sectional view of the electrical connector along line A-A shown in FIG. 2.
Figure 5:
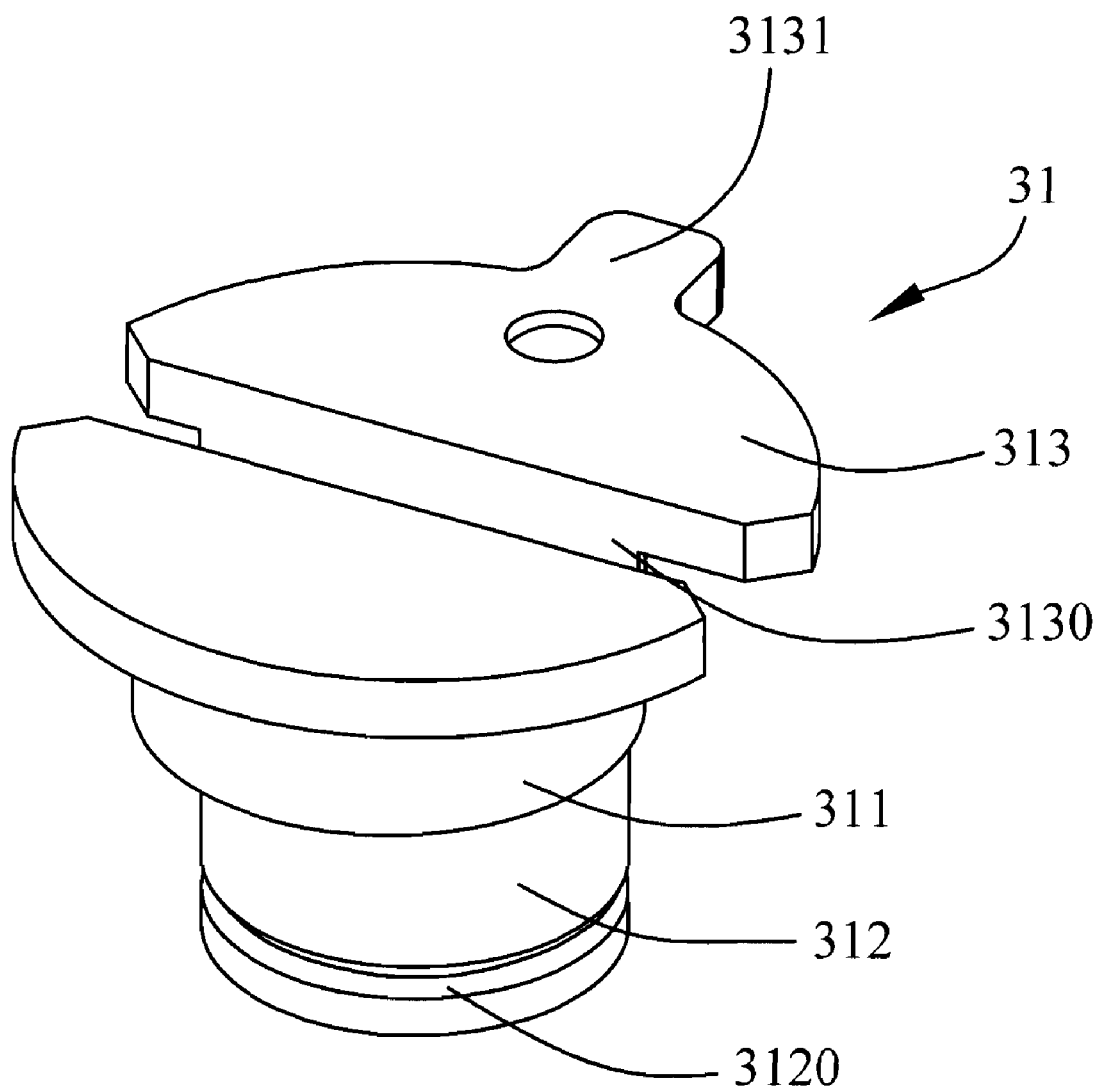
FIG. 5 is a schematic diagram illustrating the rotatable pin of the electrical connector shown in FIG. 1.
Figure 6:
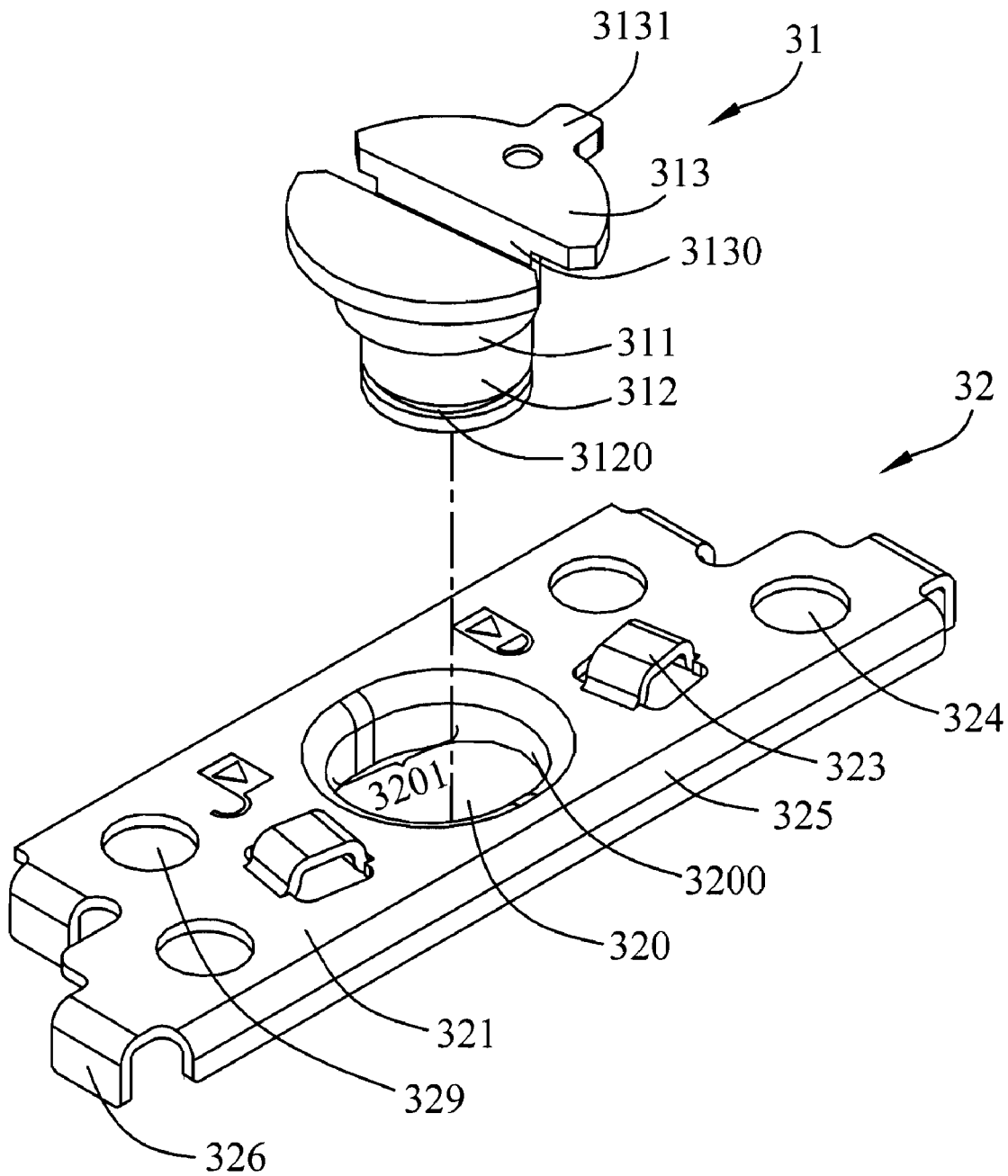
FIG. 6 is an exploded view illustrating the rotatable pin and the pushing blade of the electrical connector shown in FIG. 1.
Figure 7:
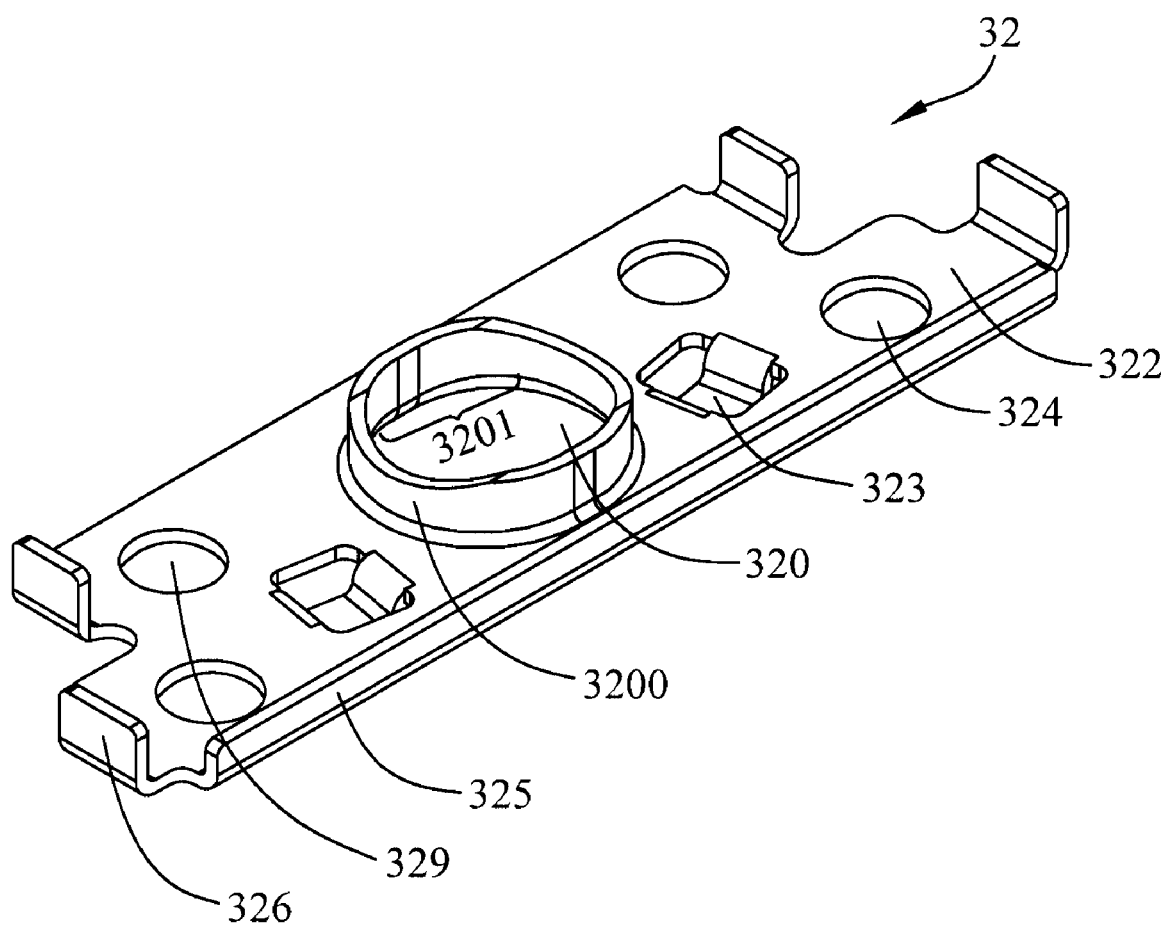
FIG. 7 is a schematic diagram of another angle of view illustrating the pushing blade of the electrical connector shown in FIG. 1.

Please refer to FIG. 2, FIG. 3, and FIG. 4. First, while assembling, the pushing blade 32 is assembled to the cover 20 with the second surface 322 of the pushing blade 32 facing toward the second head portion 22 of the cover 20 so that the first reinforcing rib 325 is engaged with the engaging groove 221 of the second head portion 22 of the cover 20, and the second reinforcing rib 326 is inserted into the through groove 223 of the second head portion 22. The long round ring 3220 on the pushing blade 32 is accommodated in the axle hole 220 of the second head portion 22, and the outer wall of the long round ring 3220 is closely in contact with the inner wall of the axle hole 220. The first positioning holes 324 are engaged with the first protrusions 222 of the second head portion 22 to totally fix the pushing blade 32 on the second head portion 22 of the cover 20. Next, the rotatable pin 31 is inserted into the long round hole 320 from the first surface 321 of the pushing blade 32 toward the long round hole 320. The first column 311 is located in the long round ring 3200. The second column 312 passes through the cover 20 and is exposed outside the cover 20, and enters the aperture 121 of the first head portion 12 of the base 10. Finally, the washer 33 is disposed on the lower surface 100 of the base 10. The circular hole 331 is engaged in the annular groove 3120 of the rotatable pin 31, and the engaging foots 330 of the washer 33 are engaged between the first bulges 123. The upper portion of the washer 33 is engaged by the second bulges 125.

Please refer to FIG. 2 and FIG. 4. While using, a screwdriver can (not shown in figures) be inserted into the rotatable groove 3130 to rotate the rotatable pin 31, and then the first column 311 and the second column 312 start to rotate. Because the diameter of the first column 311 is larger than that of the second column 312 and the first column 311 and the second column 312 are formed bias, the first column 311 moves the pushing blade 32 by pushing the long round ring 3200 while rotating. The force of pushing is mainly applied on the force-pushed region 3201 of the long round ring 3200. Because the pushing blade 32 is mounted on the cover 20, the cover 20 will be driven to slide parallelly to the base 10. While rotating, the rotatable pin 31 applies a force to the force-pushed region 3201 of the long round ring 3200 rather than to the cover 20 directly. Thus, the deformation or breakage of the plastic of the cover 20 can be prevented while the rotatable pin 31 rotates, and the cover 20 can be reinforced. That is to say, it requires no reinforcing blades in the embodiment of the invention. The pushing blade 32 not only can push the cover 20 to slide parallelly to the base 10, but also can reinforce the cover 20. The used materials can be saved and the processes can be simplified. Similarly, the assembling processes can be simplified. When the rotatable pin 31 rotates to a predetermined position, the block 3131 of the rotatable pin 31 is stopped by one of the two block portion 323 which is at two sides of the long round hole 320. Thus the rotatable pin 31 is prevented from over-rotating to damage the cover 20. The cover 20 can be further reinforced by engaging the first reinforcing rib 325 with the engaging groove 221 on the cover 20 and engaging the second reinforcing rib 326 with the through groove 223.

Accordingly, the advantages of the electrical connector of the invention are listed as following:

1. The cover 20 has the pushing blade 32. The first reinforcing rib 325 and the second reinforcing rib 326 can be engaged with the second head portion 22 of the cover 20 tightly. Moreover, the first positioning holes 324 and the second positioning holes 329 on the pushing blade 32 can be engaged with the first protrusions 222 and the second protrusions 227 on the second head portion 22. While being pushed by the rotatable pin 31, the pushing blade 32 not only can make the cover 20 to slide parallelly to the base 10 but also can reinforce the cover 20. Thus, the deformation or breakage of the cover 20 can be prevented, no matter how large the applied force is. Besides, it requires no reinforcing blades in the embodiment of the invention. The used materials can be saved and the processes can be simplified. Similarly, the assembling processes can be simplified.

2. The pushing force of the first column 311 which is induced by the rotation of the rotatable pin 31 is easy to damage the cover 20 which is plastic. However, according to said invention, the long round hole 320 is formed on the pushing blade 32, and the long round ring 3200 is extended from the long round hole 320. The force-pushed region 3201 on the long round ring 3200 is used for bearing the most pushing force and reducing the damage of the cover 20. Therefore, the pushing blade 32 can be reinforced and prevented from deformation. Because the long round ring 3200 is smooth, the friction of the rotatable pin 31 can be reduced. Moreover, the force-pushed region 3201 prevents the axle hole 220 of the cover 20 from being damaged by the rotation of the rotatable pin 31. Hereby, the axle hole 220 will not be deformed or broken.

3. The block 3131 is disposed on the rotatable pin 31, and the block portion 323 engaged with the block 3131 is disposed on the pushing blade 32 to stop at both sides when the drive mechanism 30 pushes. The cover 20 and the base 10 will not be damaged by the exceeding force, and the correctly contacting between the chip module and the contacts can be ensured.

With the example and explanations above, the features and spirits of the invention will be hopefully well described.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An electrical connector comprising:
a base having an aperture;
a cover being disposed on the base and sliding parallelly to the base, the cover having an axle hole corresponding to the aperture; and
a drive mechanism comprising:
a rotatable pin, at least a first column and a second column being bias disposed on the rotatable pin, the first column being accommodated in the axle hole, and the second column entering the aperture; and
a pushing blade, mounted on the cover, for pushing and reinforcing the cover, the pushing blade having at least one block portion corresponding to the rotatable pin, the pushing blade also having a long round hole for accommodating the rotatable pin, wherein a long round ring is extended from the long round hole to enter the axle hole.

2. The electrical connector of claim 1, wherein the pushing blade has at least one positioning hole, the cover has at least one protrusion, each protrusion engages with one corresponding positioning hole.

3. The electrical connector of claim 1, wherein the long round ring has a force-pushed region in the direction along which the cover slides with respect to the base.

4. The electrical connector of claim 1, wherein the rotatable pin has a block engaged with the block portion.

5. The electrical connector of claim 1, wherein the drive mechanism further comprises a washer.

6. The electrical connector of claim 5, wherein the washer has two engaging foots, the rotatable pin has an annular groove which engages with the engaging foots.

7. The electrical connector of claim 1, wherein at least one reinforcing rib extends downward from the edges of the pushing blade.

8. The electrical connector of claim 7, wherein the reinforcing rib comprises a first reinforcing rib and a second reinforcing rib, and the first reinforcing rib is perpendicular to the second reinforcing rib.

9. The electrical connector of claim 7, wherein the reinforcing rib is plate-shaped.

* * * * *